(12) United States Patent
Chapelon

(10) Patent No.: US 9,293,429 B2
(45) Date of Patent: Mar. 22, 2016

(54) ELECTRONIC CHIP COMPRISING CONNECTION PILLARS AND MANUFACTURING METHOD

(75) Inventor: Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 60 days.

(21) Appl. No.: 13/554,831

(22) Filed: Jul. 20, 2012

(65) Prior Publication Data

US 2013/0026627 A1    Jan. 31, 2013

(30) Foreign Application Priority Data

Jul. 20, 2011  (FR) ..................... 11/56559

(51) Int. Cl.
| | | |
|---|---|---|
| H01L 23/48 | (2006.01) | |
| H01L 23/00 | (2006.01) | |
| H01L 21/683 | (2006.01) | |
| H01L 23/31 | (2006.01) | |

(52) U.S. Cl.
CPC ............... *H01L 24/05* (2013.01); *H01L 24/03* (2013.01); *H01L 24/13* (2013.01); *H01L 21/6835* (2013.01); *H01L 23/3192* (2013.01); *H01L 23/481* (2013.01); *H01L 24/11* (2013.01); *H01L 2221/68381* (2013.01); *H01L 2224/0401* (2013.01); *H01L 2224/1147* (2013.01); *H01L 2224/11849* (2013.01); *H01L 2224/1301* (2013.01); *H01L 2224/13022* (2013.01); *H01L 2224/13147* (2013.01); *H01L 2924/01029* (2013.01); *H01L 2924/15311* (2013.01)

(58) Field of Classification Search
CPC .............................. H01L 21/48; H01L 23/768
USPC ..................... 257/41, 621, 737; 438/613, 627
See application file for complete search history.

(56) References Cited

U.S. PATENT DOCUMENTS

| | | | |
|---|---|---|---|
| 6,904,160 B2 | 6/2005 | Burgess | |
| 6,940,160 B1 | 9/2005 | Hanaoka et al. | |
| 7,687,311 B1 * | 3/2010 | Lee et al. ....................... | 438/106 |
| 7,928,713 B2 * | 4/2011 | Nguyen ........................ | 323/282 |
| 7,932,703 B2 * | 4/2011 | Brohlin et al. ................ | 323/222 |
| 8,076,234 B1 * | 12/2011 | Park et al. ..................... | 438/622 |
| 2004/0099950 A1 | 5/2004 | Ohsumi | |
| 2004/0245630 A1 | 12/2004 | Huang et al. | |
| 2005/0118803 A1 * | 6/2005 | Hichri et al. .................. | 438/672 |
| 2006/0170102 A1 | 8/2006 | Ko | |

(Continued)

FOREIGN PATENT DOCUMENTS

EP          0 540 312 A1      5/1993

OTHER PUBLICATIONS

French Search Report and Written Opinion dated Feb. 29, 2012 from corresponding French Application No. 11/56559.

*Primary Examiner* — Matthew W Such
*Assistant Examiner* — Warren H Kilpatrick
(74) *Attorney, Agent, or Firm* — Seed IP Law Group PLLC

(57) ABSTRACT

An electronic chip including a semiconductor substrate (1) covered with an insulating layer (4) including metal interconnection levels (3) and interconnection pillars (10) connected to said metal interconnection levels (3), said pillars (110) forming regions (111) protruding from the upper surface of said insulating layer (4) and capable of forming an electric contact, wherein said pillars (110) have a built-in portion (115) in a housing formed across the thickness of at least said insulating layer (4).

26 Claims, 7 Drawing Sheets

(56) References Cited

U.S. PATENT DOCUMENTS

| | | |
|---|---|---|
| 2008/0099928 A1 | 5/2008 | Lee et al. |
| 2009/0219002 A1* | 9/2009 | Shirai et al. ............... 323/282 |
| 2009/0294983 A1 | 12/2009 | Cobbley et al. |
| 2010/0109158 A1* | 5/2010 | Platz et al. ............... 257/737 |
| 2010/0164109 A1 | 7/2010 | Chiou et al. |
| 2010/0187677 A1 | 7/2010 | Lee |

\* cited by examiner

US 9,293,429 B2

ELECTRONIC CHIP COMPRISING CONNECTION PILLARS AND MANUFACTURING METHOD

TECHNICAL FIELD

The present disclosure relates to microelectronics. It more specifically relates to specific layouts involving interconnection pillars which are formed on the chip surfaces to enable their connection with adjacent chips or with packages.

BACKGROUND

Generally, electronic components may comprise several integrated circuits formed within separate chips, which are associated inside of a same package. It is necessary to form electric connections between the different tracks of the chips which need to be interconnected, as well as between the chips and the different electric tracks which come out of the package.

A solution used is to create, inside of the chip substrate layer, through interconnection vias which are formed of a conductive material, such as copper or the like.

On one side, the vias are connected to the tracks of the internal functional areas of the integrated circuit. At their other end, the vias emerge on one of the chip surfaces. These vias may be present on the upper surface side of the chip, or "front" side, that is, on the side where the substrate comprises active areas where transistors or the like are implanted. Frequently, however, these vias emerge on the opposite surface, or "back side" of the chip.

It is also possible to form connection areas on the front surface side of the chip, by forming connection areas connected to one of the metallization levels, generally the upper metallization level, formed in the insulating layer (or "back-end" layer) which covers the substrate. This insulating layer comprising metallization levels should not be mistaken for the passivation layer separating the metallization levels and the metal areas forming contact pads from the conducting layers forming a redistribution line (RDL), which are sometimes placed on top of the "back-end" layer.

Protruding areas are created on one and/or the other of the chip surfaces. They are arranged to be, on the one hand, connected to the interconnection vias or to the metallization level and, on the other hand, to be able to be soldered to the adjacent chips or to the package.

A known embodiment comprises using, as protruding areas, metal balls or spheres, generally called bumps, which are deposited on the front and/or back sides of the chip, at the level of the appropriate areas, and which will come into contact with the connections of the adjacent chip.

The bump technique has been progressively replaced with a so-called interconnection pillar technique, to increase the density of connection points. Indeed, bumps have a spherical geometry, whereby their bulk compared with the effective contact area crossed by the current is not optimal.

Conversely, interconnection pillars have a cylindrical geometry, which makes it possible to implant a larger number thereof per surface area unit.

Such interconnection pillars are generally made of copper. They are formed by electrodeposition from seed layers deposited in appropriate areas of the surface of the involved chip.

SUMMARY

Now, the Applicant has observed that certain operations, in the context of the chip manufacturing or of the association of different chips, may risk damaging interconnection pillars.

Indeed, at certain chip manufacturing stages, it is necessary to work on the back side of the chip. To reach this back side, the chip must be manipulated by being associated by its front side to a mechanical support element having a much greater size than the chip. To achieve this, the front side of the chip is positively connected to a support element, also called "handle", by means of an adhesive material.

Once the operations on the back side have been carried out, the chip must be separated from the support element.

This separation is performed by heating the adhesive and applying a transverse load, which causes the shearing of the adhesive layer and separates the chip from the support. In the case where the front surface comprises interconnection pillars, the Applicant has observed that the transverse load applied by this element in contact with the front surface can cause the tearing off of the interconnection pillars, or delaminations in the stack of metal interconnection layers of the chip, which may cause a failure of said chip.

Further, in the case where the chip is transferred by its front side in a package (of BGA, or Ball Grid Array type) or directly on an electronic card, the Applicant has observed that the difference in thermal expansion coefficient between the chip silicon and the materials forming the package or the card, may stress the interconnection pillars, with the same risks as discussed hereabove.

To decrease or suppress such risks, the Applicant has devised a new layout in terms of placing of the interconnection pillars.

Thus, an embodiment of the present invention provides an electronic chip comprising a semiconductor substrate covered with an insulating layer comprising metal interconnection levels and interconnection pillars connected to said metal interconnection levels, said pillars forming regions protruding from the upper surface of said insulating layer, and capable of forming an electric contact, wherein said pillars have a built-in portion in a housing formed across the thickness of at least said insulating layer.

According to different alternative embodiments, the housing may be formed across a fraction of the thickness of said insulating layer, or cross said insulating layer and a portion of the substrate thickness.

In practice, the insulating layer may comprise a metal layer crossed by said housing.

According to various embodiments, the cross-section of the built-in fraction of the interconnection pillar may be smaller than or identical to the cross-section of the protruding portion of said pillar.

According to some embodiments, the housing may have an insulating layer interposed between, on the one hand, the material of the pillar and, on the other hand, the insulating layer and the substrate.

Further, the pillar may have a shoulder coming into contact with said metal layer.

In practice, the depth of the housing may range between approximately 20 and 50% of the height of the protruding portion of the pillar.

As a complement, the present invention provides a method for manufacturing an electronic chip comprising a semiconductor substrate, covered with an insulating layer comprising metal interconnection levels, wherein at least one housing is formed across the thickness of at least said insulating layer, the forming of said housing exposing a fraction of said metal interconnection levels, and wherein an interconnection pillar is formed inside of each housing, said pillar coming into contact with said fraction of said metal interconnection levels, said pillar forming a region protruding from the upper surface of said insulating layer.

According to various alternative embodiments, the housing is formed by crossing the entire thickness of said insulating layer, or a fraction only of the thickness of said insulating layer.

In certain cases, it is advantageous to deposit a layer of insulating material in said housing before forming the interconnection pillar.

The foregoing and other objects, features, and advantages of the present invention will be discussed in detail in the following non-limiting description of specific embodiments in connection with the accompanying drawings.

DETAILED DESCRIPTION

Figure 1:
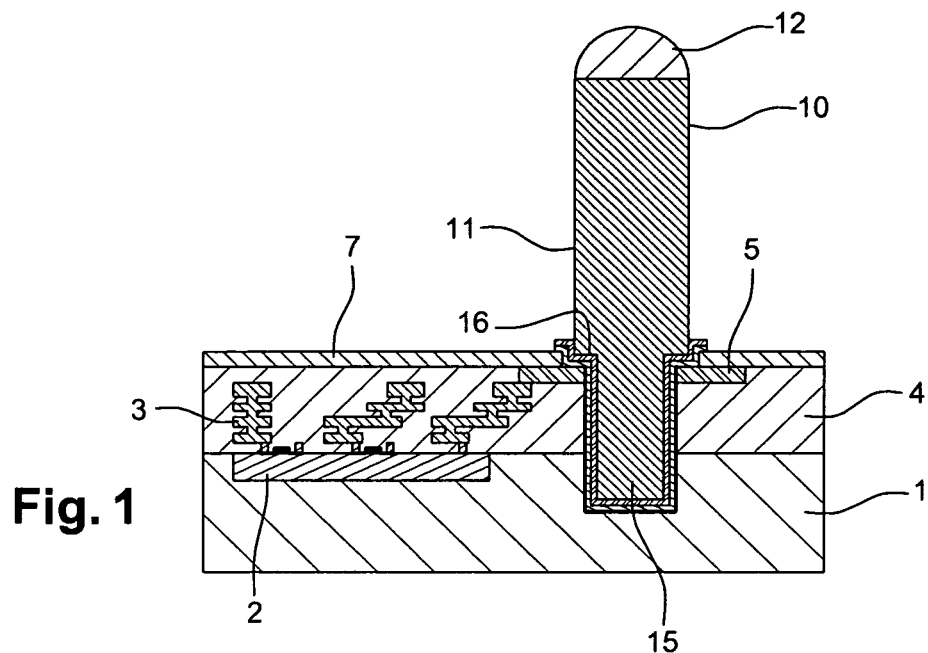
FIG. 1 is a partial cross-section view of a chip comprising an interconnection pillar according to a first embodiment.

On manufacturing of an electronic chip, a functional area 2 is generally formed on one of the surfaces of a semiconductor wafer. This functional area comprises different transistors or the like necessary to implement the dedicated chip functions. Functional area 2, formed in semiconductor substrate layer 1, is connected to different metal interconnection levels 3 formed inside of an insulating layer, typically made of oxide or the like, and also called back-end layer.

Functional area 2 has been shown in a simplified manner since it is not indispensable to the understanding of the present invention.

The different metal interconnection levels 3 enable to form the connection between functional area 2 and the upper surface of back-end layer 4. In its uppermost portion, back-end layer 4 supports metallized areas 5, sometimes referred to as "pads", typically formed of copper, aluminum, or the like, on which are formed the areas of connection with the adjacent elements, which may be other chips or packages, for example.

Conventionally, the upper surface of back-end layer 4 is covered with a passivation layer 7, which may be of various natures, for example, formed of a silicon nitride layer deposited on an oxide layer, itself doped, for example, with phosphorus. This passivation layer 7 should not be mistaken for the back-end layer 4, comprising the metallization levels. Sometimes, conducting layers, known to a person skilled in the art as redistribution lines (RDL), not shown in any of the drawings enclosed, are formed on top of this passivation layer. These conducting layers ensure a better electric contact between the pads 5 and the pillars or bumps that can be found in the prior art.

In the embodiment illustrated in FIG. 1, the chip comprises an interconnection pillar 10, which has an apparent portion 11 above passivation layer 7. This apparent portion is topped with a dome 12 intended to ease the soldering to the adjacent elements, and typically based on a tin-silver alloy.

Interconnection pillars 10 comprise a built-in fraction 15 inside of the chip and which crosses back-end layer 4 and a portion of substrate layer 1.

It should be noted that the width of built-in portion 15 shown in cross-section view is smaller than the width of apparent portion 11 of the pillar. This width difference defines a shoulder 16 which enables the pillar to rest on metal layer 5, thus creating an electric contact between pillar 10 and interconnection levels 3.

In practice, the anchoring depth of pillar 10, that is, the height of built-in portion 15, ranges between approximately 20 and 50% of the height of apparent portion 11, that is, the portion located above passivation layer 7.

Such a deep anchoring may be preferred for large interconnection pillars, that is, is typically, pillars having a diameter greater than 25 micrometers and having a height greater than 30 micrometers.

Such an interconnection pillar may be formed according to a method illustrated in FIGS. 2 to 13.

Figure 2:
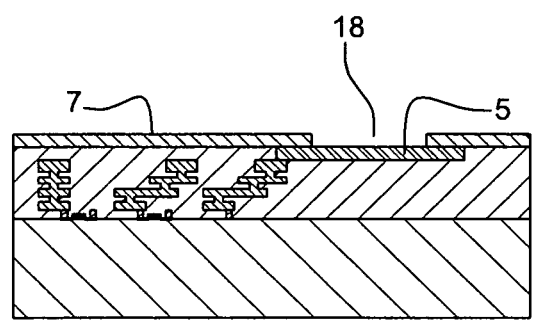
FIGS. 2 to 13 are cross-section views similar to FIG. 1 illustrating the different steps enabling to form the connection pillar illustrated in FIG. 1.

Thus, at a given stage of the chip manufacturing and as illustrated in FIG. 2, passivation layer 7 is etched above metallization layer 5 to define an opening 18 exposing a fraction of metallization layer 5.

Figure 3:
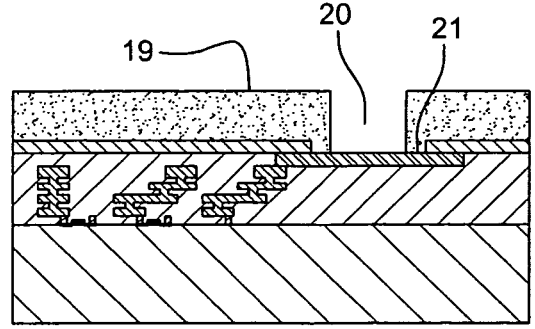

In a second step illustrated in FIG. 3, a photolithography mask 19 is deposited, to be subsequently removed from an area 20 located above opening 18, thus exposing metallization layers 5. It should be noted that opening 20 is smaller than opening 18, so that a portion of the resin mask covers peripheral portion 21 of opening 18, to form the future area of electric contact with the pillar, corresponding to shoulder 16 illustrated in FIG. 1.

Figure 4:
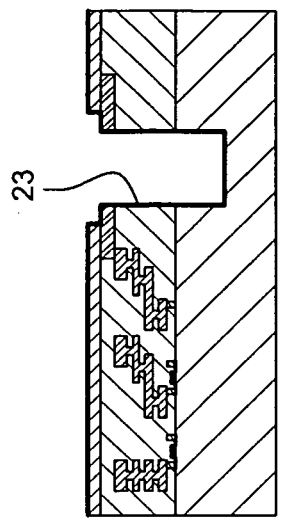

In a subsequent step illustrated in FIG. 4, different etch steps enabling to remove the layers accessible through opening 20 are carried out. A first etching thus enables to remove metallization layer 5. A second etching enables to remove the silicon oxide layer forming the back-end layer. A third step then enables to etch a fraction of the thickness of substrate layer 1 to thus form well 22, which will form the housing of the built-in portion of pillar 10. Resin layer 19 is then removed.

Figure 5:
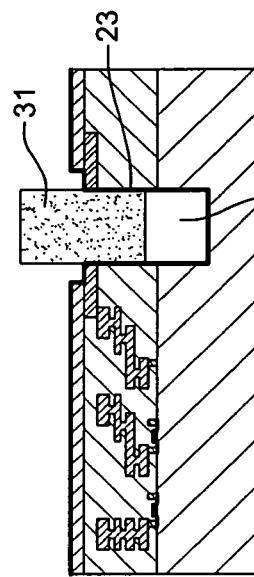

In a subsequent step illustrated in FIG. 5, the assembly receives the deposition of an insulating layer, typically based on silicon oxide, which may advantageously be deposited by an SACVD (Sub Atmospheric Chemical Vapor Deposition) technique.

It should be noted that this deposition is conformal, that is, it lines the sides of well 22, thus enabling to create an insulation between, on the one hand, the materials which will then be deposited inside of the well and, on the other hand, the rest of the component and especially substrate layer 1.

Figure 6:
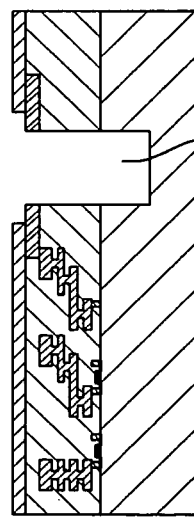
Figure 7:
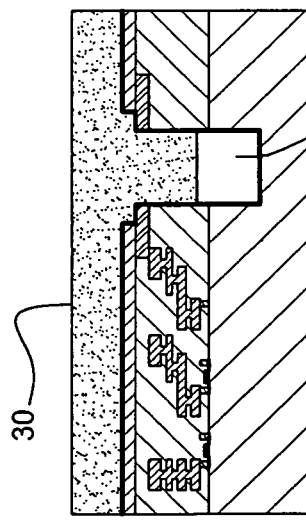

In a subsequent step illustrated in FIG. 6, a resin mask 30 which partially closes well 22 is deposited. Resin layer 30 is then removed to be only kept in fraction 31 above well 22. Resin fraction 31 enables to protect the sides of well 22, and especially oxide layer 23. In a subsequent step illustrated in FIG. 8, the oxide layer which had been deposited full wafer is then removed from the apparent portions. According to the type of oxide used, the etching may be dry or wet. As already mentioned, it remains within well 22.

Figure 9:
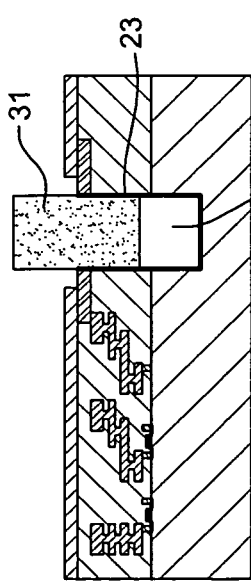

In a subsequent step illustrated in FIG. 9, resin layer 31 is then removed to fully expose well 22 where the built-in portion of the pillar will be deposited later on.

Figure 10:
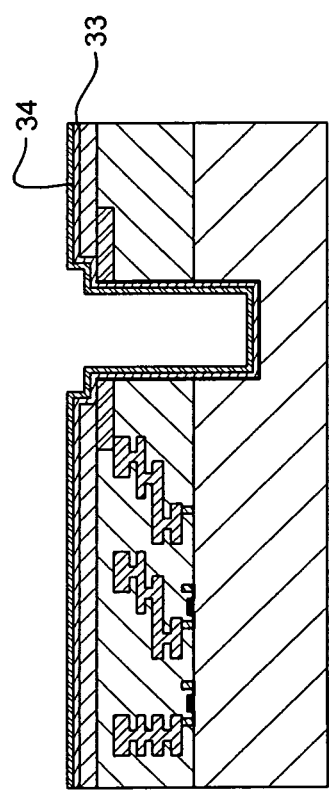

In a subsequent step illustrated in FIG. 10, a layer forming a barrier against the diffusion of copper 33, which may typically be formed of tantalum and/or tantalum nitride, or even of titanium nitride, is deposited full-wafer.

This layer is deposited by a physical vapor deposition method (PVD), for a thickness on the order of hundreds of nanometers. After, a copper seed layer 34 is deposited, also by PVD.

Figure 8:
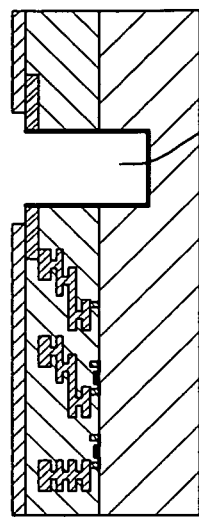

It should be noted that due to the removal of insulator 23 from shoulder areas 21, as previously illustrated in FIG. 8, conductive layers 33 and 34 are electrically connected to metallization layer 5.

Figure 11:
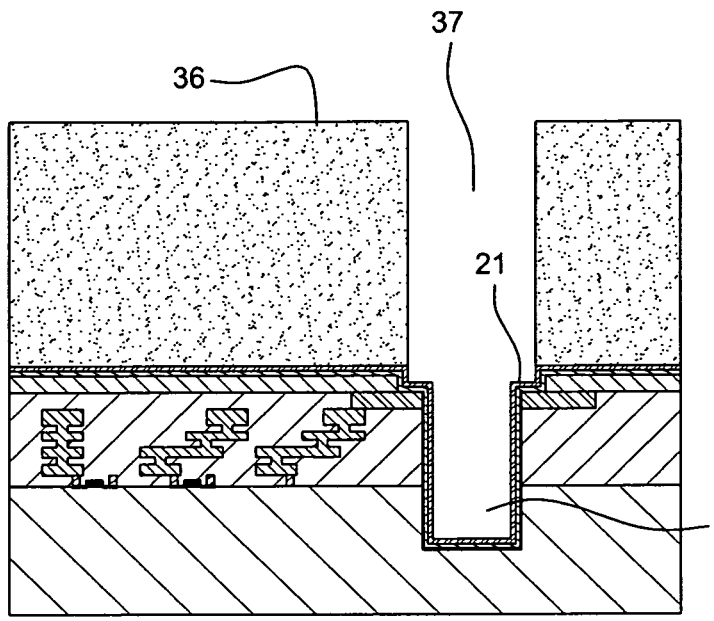

Then, and as illustrated in FIG. 11, a resist mask 36 is deposited and then opened at the level of well 22 to form opening 37. It should be noted that opening 37 exposes portions 21 of metallization layer 5 covered by conductive layers 33 and 34, thus enabling to form the electric connection between the pillar and metallization level 5, given that the vertical sides of well 22 are covered with an oxide layer 23 which partially covers the lateral sides of the opening formed in metallization layer 5.

Figure 12:
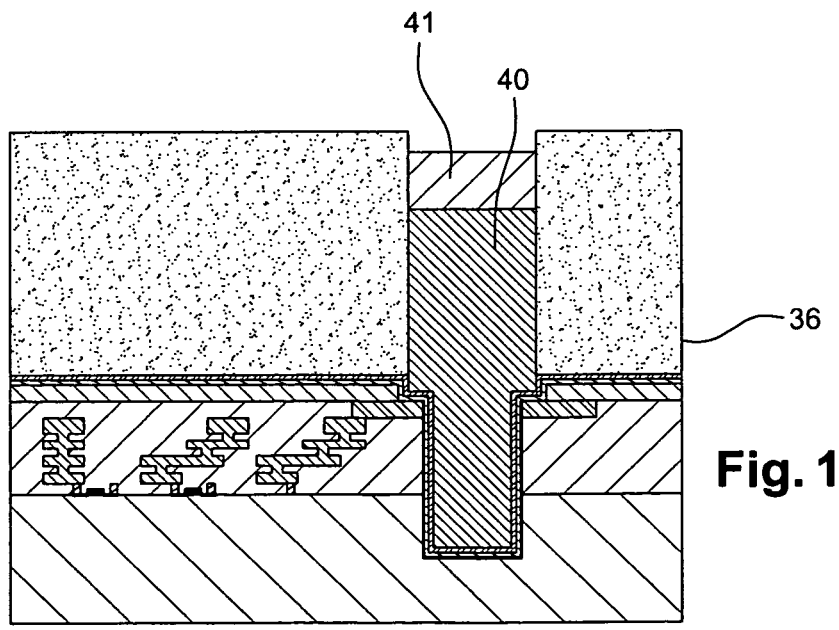

After, and as illustrated in FIG. 12, a copper electrodeposition is carried out, by electric contacting at the wafer edges, at the level of seed layer 34.

Figure 13:
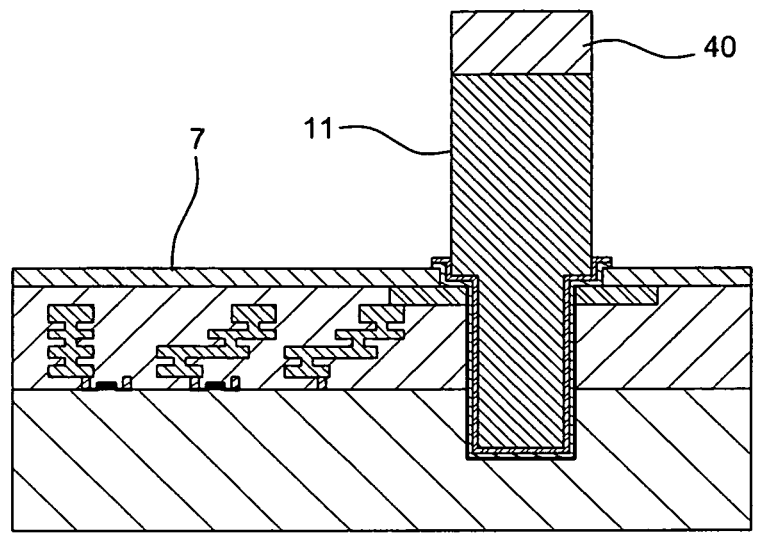

The deposition of copper 40 is interrupted when the desired pillar height has been reached. The copper deposition is continued by the deposition of a conductive material of low melting point, typically a tin/silver alloy. Then, as illustrated in FIG. 13, resin mask 36 is removed to expose visible portion 11 of the pillar and tin/silver deposit 40.

Seed layer 34 and copper diffusion barrier layer 33 are then removed to expose initial passivation layer 7.

A subsequent anneal step enables to give tin/silver deposit 40 a dome shape such as illustrated in FIG. 1.

Figure 14:
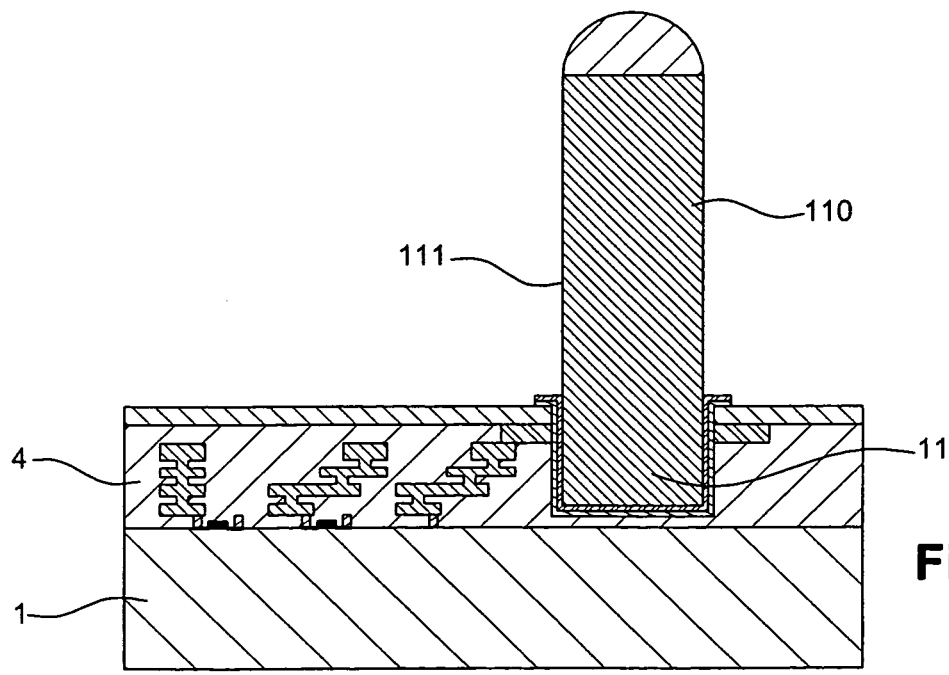
FIG. 14 is a partial cross-section view of a chip comprising an interconnection pillar according to a second embodiment.

According to another embodiment illustrated in FIG. 14, copper pillar 110 has a buried portion 115 with a cross-section similar to the cross-section of apparent portion 111. Built-in portion 115 penetrates inside of back-end oxide layer 4, without coming into contact with substrate layer 1.

Thereby, since back-end layer 4 is insulating by nature, it is not necessary to deposit an insulating layer inside of the housing receiving the pillar, as in the first embodiment. This has the advantage of simplifying the manufacturing process, in the case where the mechanical anchoring does not have to be extremely resistant.

Figure 15:
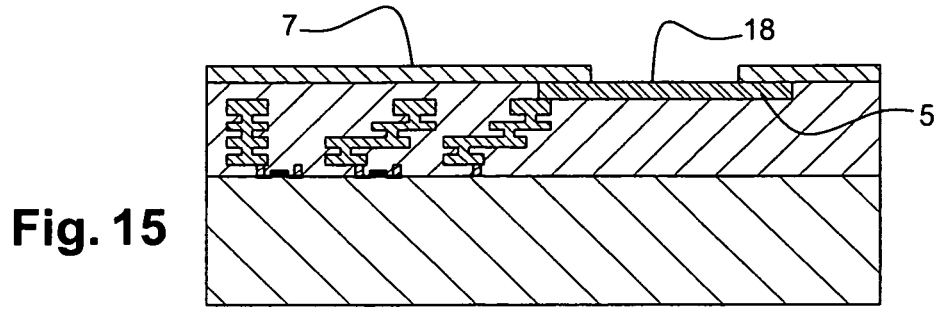
FIGS. 15 to 19 are cross-section views similar to FIG. 14, illustrating the different steps enabling to form the connection pillar illustrated in FIG. 14.

A manufacturing method for obtaining the structure of FIG. 14 comprises, as illustrated in FIG. 15, a first step similar to that illustrated in FIG. 2, which comprises etching the passivation layer to expose a portion 118 of metallization layer 5.

Figure 16:
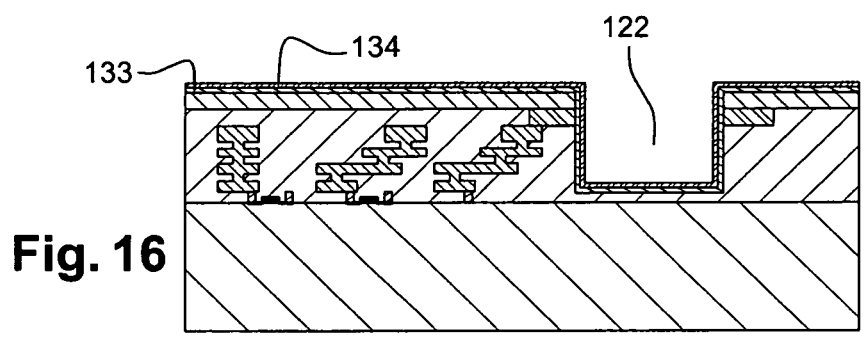

In a second step illustrated in FIG. 16, apparent portion 118 of metallization layer 5 is exposed, after which back-end layer 4, located underneath, is etched to define well 122. It should be noted that well 122 has a width substantially identical to that of opening 18 formed on the passivation layer and does not penetrate into substrate 1.

In a subsequent step, a layer forming a barrier against the diffusion of copper is deposited by PVD, for example, after which a copper seed layer is deposited, both depositions being performed over the entire wafer surface.

Figure 17:
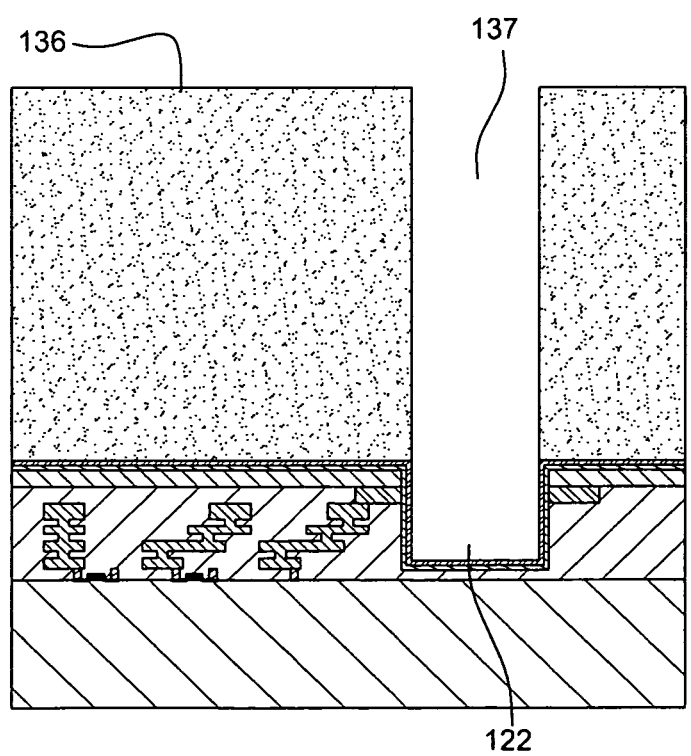
Figure 18:
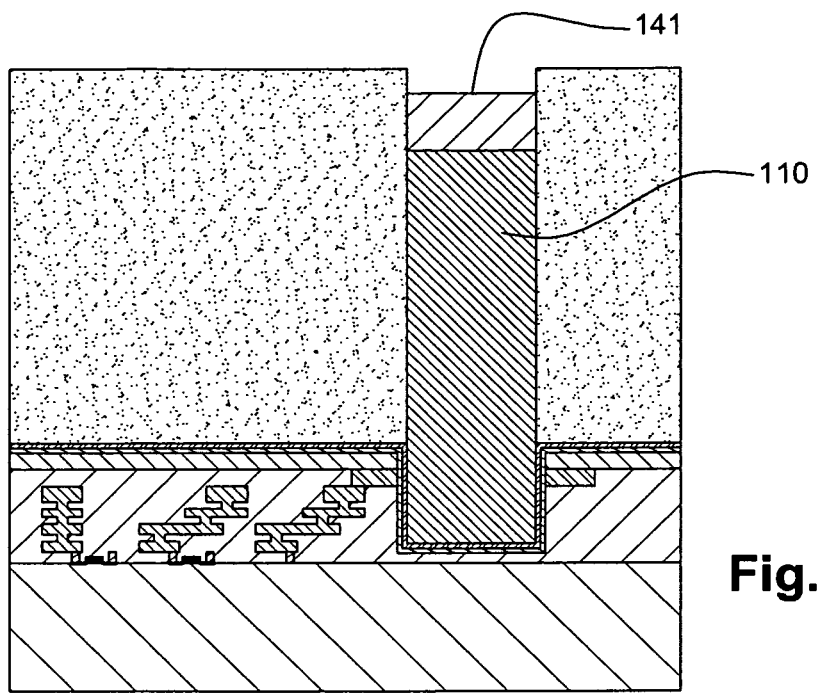

In a subsequent step illustrated in FIG. 17, a resin mask 136 is deposited, said resin mask having a recess 137 formed therein above well 122.

Then, in a subsequent step, an electrolytic deposition is performed to form copper pillar 110, and for the subsequent deposition of materials of tin/silver type enabling to solder the pillar to other components or to the package.

Figure 19:
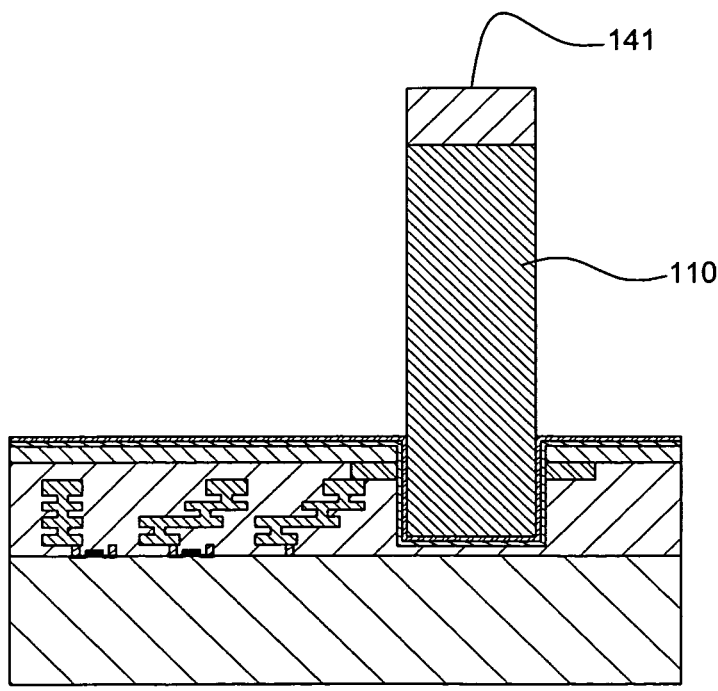

Then, in a step illustrated in FIG. 19, resin mask 136, seed layers 134, and diffusion barrier layer 133 are removed to disengage pillar 110.

A subsequent anneal step enables to give the silver/tin deposit a dome shape such as illustrated in FIG. 14.

As appears from the foregoing, the described embodiments enable to provide an anchoring of the interconnection pillars, which very strongly decreases risks of tearing off under a transversal load and risks of delamination within the metal interconnection layers. According to the estimated stress level, it is thus possible to perform a particularly deep anchoring all the way to the inside of the semiconductor substrate layer. When the estimated stress level is lower, an anchoring in the back-end layer only may be sufficient, which enables to take advantage of a simplified pillar forming method.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic chip comprising a semiconductor substrate covered with an insulating layer comprising metal interconnection levels and at least one interconnection pillar connected to said metal interconnection levels, said at least one pillar having a first portion protruding from an upper surface of said insulating layer, and configured to form an electric contact, wherein said at least one pillar, has a second portion that extends through only a portion of a thickness of said insulating layer, or through the thickness of said insulating layer and through only a portion of a thickness of said semiconductor substrate, a housing including a shoulder at an opening of the housing and a barrier layer deposited on the shoulder.

2. The electronic chip of claim 1, wherein the housing is formed through a fraction of the thickness of said insulating layer.

3. The electronic chip of claim 1, wherein the housing crosses said insulating layer and a portion of the substrate.

4. The electronic chip of claim 1, wherein the insulating layer comprises a metal layer crossed by said housing.

5. The electronic chip of claim 3, wherein a cross-section of the built-in portion of the interconnection pillar is smaller than a cross-section of the protruding portion of said pillar.

6. The electronic chip of claim 2, wherein a cross-section of the built-in portion of the interconnection pillar is identical to a cross-section of the protruding portion of said pillar.

7. The electronic chip of claim 3, wherein the housing has an insulating layer interposed between, on the one hand, the material of the pillar and, on the other hand, the insulating layer and the substrate.

8. The electronic chip of claim 4, wherein the pillar has a shoulder coming into contact with said metal layer.

9. The electronic chip of claim 8, wherein a depth of the housing ranges between 20% and 50% of the height of the protruding portion of the pillar.

10. A method for manufacturing an electronic chip comprising a semiconductor substrate covered with an insulating layer comprising metal interconnection levels, wherein at least one housing is formed to extend through only a portion of a thickness of said insulating layer, or through the thickness of said insulating layer and through only a portion of a thickness of said semiconductor substrate, the forming of said housing exposing a fraction of said metal interconnection levels, and wherein a first portion of an interconnection pillar is formed inside of each housing, said first portion of pillar coming into contact with said fraction of said metal interconnection levels, said pillar having a second portion protruding from an upper surface of said insulating layer, the housing including a shoulder at an opening of the housing and a barrier layer deposited on the shoulder.

11. The method of claim 10, wherein the housing is formed by completely crossing the thickness of said insulating layer.

12. The method of claim 11, wherein an insulating material layer is deposited in said housing before the interconnection pillar is formed.

13. The method of claim 10, wherein the housing is formed by crossing a fraction only of the thickness of said insulating layer.

14. An integrated circuit chip comprising:
a substrate covered with an insulating layer that includes at least one metal interconnection level; and
at least one interconnection pillar connected to the metal interconnection level, the interconnection pillar including exposed first portion that extends above the insulating layer and a second portion in a well in the insulating layer, wherein the second portion extends through only a portion of a thickness of the insulating layer without contacting the substrate, or through the thickness of the insulating layer and through only a portion of a thickness of the substrate, wherein the second portion is integral with the first portion.

15. An integrated circuit chip as defined in claim 14, further comprising a layer of insulating material in the well between the interconnection pillar and the insulating layer.

16. An integrated circuit chip as defined in claim 15, further comprising a diffusion barrier in the well over the layer of insulating material.

17. An integrated circuit chip as defined in claim 16, further comprising a seed layer in the well over the diffusion barrier.

18. An integrated circuit chip as defined in claim 14, wherein the well is formed through a fraction of a thickness of the insulating layer.

19. An integrated circuit chip as defined in claim 14, wherein the well crosses the insulating layer and a portion of the substrate.

20. An integrated circuit chip as defined in claim 14, wherein a cross-section of the built-in portion of the interconnection pillar is smaller than a cross-section of the exposed portion of the interconnection pillar.

21. An integrated circuit chip as defined in claim 14, wherein the interconnection pillar includes a shoulder that contacts the metal interconnection level.

22. A method for making an integrated circuit chip using a substrate covered with an insulating layer that includes at least one metal interconnection level, the method comprising:
forming a well in the insulating layer; and
forming an interconnection pillar in the well in contact with the metal interconnection layer, the interconnection pillar including an exposed portion above the insulating layer and a built-in portion in the well, wherein the built-in portion is formed to extend through only a portion of a thickness of the insulating layer without contacting the substrate, or through the thickness of the insulating layer and through only a fraction of a thickness of the substrate, and wherein the build-in portion is integral with the exposed portion.

23. A method for making an integrated circuit chip as defined in claim 22, further comprising forming a layer of insulating material in the well between the interconnection pillar and the insulating layer.

24. A method for making an integrated circuit chip as defined in claim 23, further comprising forming a diffusion barrier in the well over the layer of insulating material.

25. A method for making an integrated circuit chip as defined in claim 24, further comprising forming a seed layer in the well over the diffusion barrier.

26. A method for making an integrated circuit chip as defined in claim 22, wherein forming the interconnection pillar comprises electrodeposition of copper in the well.

* * * * *